(12) United States Patent
Philip et al.

(10) Patent No.: US 11,812,676 B2
(45) Date of Patent: Nov. 7, 2023

(54) MULTI-TERMINAL PHASE CHANGE MEMORY DEVICE

(71) Applicant: INTERNATIONAL BUSINESS MACHINES CORPORATION, Armonk, NY (US)

(72) Inventors: Timothy Mathew Philip, Albany, NY (US); Lawrence A. Clevenger, Saratoga Springs, NY (US); Kevin W. Brew, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 31 days.

(21) Appl. No.: 16/828,242

(22) Filed: Mar. 24, 2020

(65) Prior Publication Data

US 2021/0305505 A1 Sep. 30, 2021

(51) Int. Cl.
*H10N 70/20* (2023.01)
*H10N 70/00* (2023.01)

(52) U.S. Cl.
CPC ......... *H10N 70/861* (2023.02); *H10N 70/011* (2023.02); *H10N 70/231* (2023.02); *H10N 70/253* (2023.02); *H10N 70/823* (2023.02); *H10N 70/826* (2023.02); *H10N 70/8413* (2023.02); *H10N 70/883* (2023.02); *H10N 70/8828* (2023.02)

(58) Field of Classification Search
CPC . H01L 45/06; H01L 45/1206; H01L 45/1226; H01L 45/1233; H01L 45/126; H01L 45/128; H01L 45/144; H01L 45/145; H01L 45/16; H10N 70/011; H10N 70/231; H10N 70/253; H10N 70/8413; H10N 70/861; H10N 70/8828; H10N 70/011231
See application file for complete search history.

(56) References Cited

U.S. PATENT DOCUMENTS

| 7,696,018 B2 | 4/2010 | Oliva et al. |
| 8,164,949 B2 | 4/2012 | Savransky |
| 8,471,236 B2 | 6/2013 | Breitwisch et al. |
| 8,822,967 B2 | 9/2014 | Kordus, II et al. |
| 9,082,954 B2 | 7/2015 | Lung et al. |
| 9,293,199 B2 | 3/2016 | Krebs et al. |
| 9,570,169 B1 | 2/2017 | Czornomaz et al. |
| 2003/0123277 A1* | 7/2003 | Lowrey ............ G11C 13/0004 365/148 |

(Continued)

FOREIGN PATENT DOCUMENTS

CN 101116195 A 1/2008

OTHER PUBLICATIONS

Koelmans et al., "Projected Phase-Change Memory Devices", Nature Communications, Sep. 2015, pp. 1-7.

(Continued)

*Primary Examiner* — Herve-Louis Y Assouman
*Assistant Examiner* — Christopher M Roland
(74) *Attorney, Agent, or Firm* — Tutunjian & Bitetto, P.C.; Robert Richard Aragona

(57) ABSTRACT

A phase change memory device is provided. The phase change memory device includes a phase change memory material within an electrically insulating wall, a first heater terminal in the electrically insulating wall, and two read terminals in the electrically insulating wall.

18 Claims, 8 Drawing Sheets

(56) References Cited

U.S. PATENT DOCUMENTS

| | | | |
|---|---|---|---|
| 2005/0029502 A1 | 2/2005 | Hudgens | |
| 2006/0001017 A1* | 1/2006 | Chang | H01L 45/122 257/3 |
| 2006/0284156 A1 | 12/2006 | Happ | |
| 2007/0155093 A1* | 7/2007 | Jeong | H01L 45/1233 438/257 |
| 2007/0159894 A1 | 7/2007 | Huber et al. | |
| 2008/0048169 A1* | 2/2008 | Doyle | H01L 45/06 257/4 |
| 2009/0001336 A1* | 1/2009 | Habib | H01L 45/143 257/2 |
| 2009/0016100 A1* | 1/2009 | Jeong | G11C 13/0004 365/210.1 |
| 2009/0052236 A1* | 2/2009 | Bae | G11C 11/56 365/163 |
| 2009/0067230 A1* | 3/2009 | Koh | G11C 13/0004 365/163 |
| 2009/0189142 A1* | 7/2009 | Chen | H01L 45/126 257/4 |
| 2010/0163826 A1* | 7/2010 | Peters | H01L 45/1683 257/3 |
| 2010/0163828 A1* | 7/2010 | Tu | H01L 27/2409 257/3 |
| 2014/0061580 A1 | 3/2014 | Krebs et al. | |
| 2014/0367630 A1 | 12/2014 | Asano | |

OTHER PUBLICATIONS

International Search Report from corresponding PCT Application Serial No. PCT/IB2021/061178 dated May 17, 2021.

* cited by examiner

MULTI-TERMINAL PHASE CHANGE MEMORY DEVICE

BACKGROUND

The present invention generally relates to a phase change memory (PCM) device, and more particularly to a phase change memory (PCM) device with multiple terminals.

Phase change memory can use the difference in resistivity between an amorphous phase and a crystalline phase to establish a state of a memory cell, where the crystalline and amorphous states of the phase change memory material can have detectably different electrical resistivity values. The amorphous state of the phase change memory material can have a high resistivity.

SUMMARY

In accordance with an embodiment of the present invention, a phase change memory device is provided. The phase change memory device includes a phase change memory material within an electrically insulating wall, a first heater terminal in the electrically insulating wall, and two read terminals in the electrically insulating wall.

In accordance with another embodiment of the present invention, a phase change memory device is provided. The phase change memory device includes a phase change memory material within an electrically insulating wall. The phase change memory device further includes two heater terminals in the electrically insulating wall, wherein the heater terminals are on opposite sides of the phase change memory material, and two read terminals in the electrically insulating wall, wherein the read terminals are on opposite sides of the two heater terminals.

In accordance with yet another embodiment of the present invention, a method of forming a phase change memory device. The method includes forming a base plate layer on a substrate. The method further includes forming a first read terminal and a first heater terminal in the base plate layer. The method further includes forming a patterned phase change material having a first phase on the base plate layer, and forming an encapsulation layer on the patterned phase change material. The method further includes forming a second read terminal in the encapsulation layer, wherein the second read terminal is in electrical contact with the patterned phase change material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a multi-terminal phase change memory (PCM) device that has less resistance drift than dual terminal phase change memory devices. Use of separate read and write terminals for control of the phase change memory phase conversion can provide more linear conductance for analog computing devices. The multi-terminal device can avoid amorphous resistivity drift that can result from using a heater terminal for read cycles.

Embodiments of the present invention provide a method of fabricating multi-terminal phase change memory (PCM) devises that avoid amorphous resistivity drift by forming separate heaters to control write processes that change the phase of the phase change memory material. Forming four electrical terminals, where two terminals are used to read data stored in the phase change memory device and two separate terminals that alter the volume of the amorphous phase change memory material can enhance control over the phase drift of the PCM devices.

Embodiments of the present invention provide a method of reading and writing to multi-terminal phase change memory (PCM) devises that avoid amorphous resistivity drift. Using two terminals to read data stored in the phase change memory device and two separate terminals to write to the device by altering the relative volumes of the amorphous and crystalline phase change memory material can enhance control over the phase drift of the PCM devices. The read current path can bypass the amorphous volume of the phase change memory using the separate read terminals.

Embodiments of the present invention provide a multi-terminal phase change memory (PCM) devise that can store multiple data bits through control of the relative volumes of the amorphous and crystalline phase change memory material in the electrical read path of the device.

Exemplary applications/uses to which the present invention can be applied include, but are not limited to: non-volatile memory devices, storage-class memory, embedded cache memory, weight storage for analog computing applications, and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
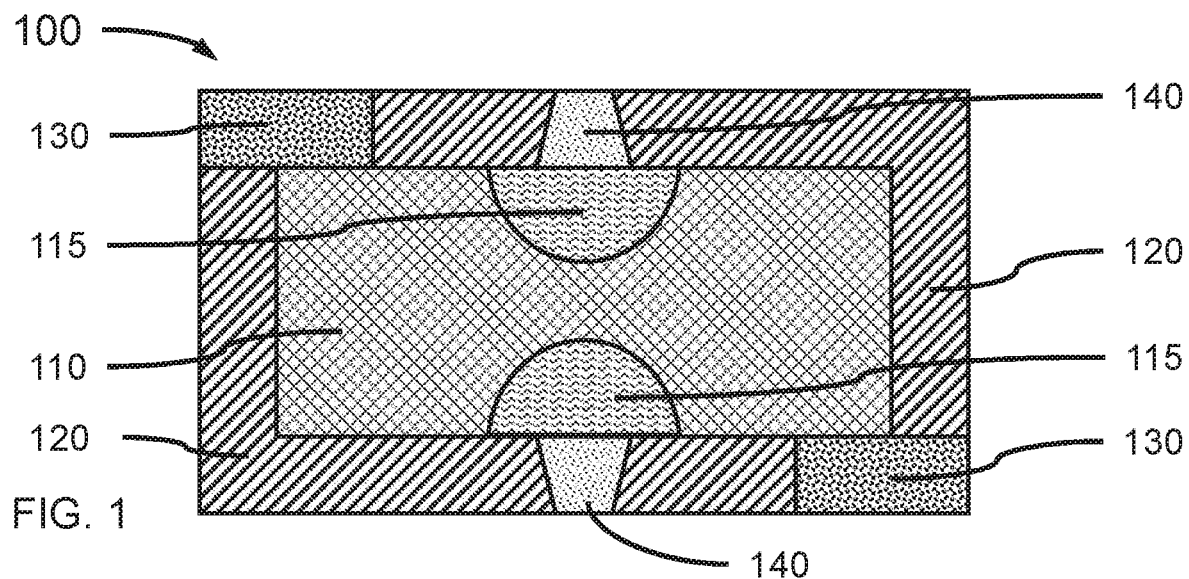
FIG. 1 is a cross-sectional side view showing a phase change memory device having a pair of write terminals and a separate pair of read terminals, in accordance with an embodiment of the present invention.

Referring now to the drawings in which like numerals represent the same or similar elements and initially to FIG. 1, a cross-sectional side view of a phase change memory device having a pair of write terminals and a separate pair of read terminals is shown, in accordance with an embodiment of the present invention.

In one or more embodiments, a phase change memory device 100 can have a phase change material in a first phase 110 and a phase change material in a second phase 115, where the first phase and second phase have different resistivities. An electrically insulating wall 120 can surround the phase change material to contain current flow to the phase change material.

In one or more embodiments, the phase change memory material can be $Ge_2Sb_2Te_5$ (GST), where the GST can have a crystalline phase and an amorphous phase, where the crystalline phase has a lower resistivity than the amorphous phase. The crystalline phase can be changed into the amorphous phase by heating the crystalline phase to a phase change temperature and quickly reducing the temperature of the amorphous phase change material to quench the phase change material in the amorphous phase.

In various embodiments, the phase change memory device 100 can have two read terminals 130 formed in the electrically insulating wall 120, where each of the two read terminals 130 is electrically coupled to the phase change material volume. In various embodiments, the phase change memory device 100 can have two heater terminals 140 formed in the electrically insulating wall 120, where each of the two heater terminals 140 is electrically coupled to the phase change material volume. The two heater terminals 140 can be formed in opposing electrically insulating walls 120, where the two heater terminals 140 can be directly opposite each other across an intervening volume of phase change memory material. The two read terminals 130 can be on opposite sides of the two or more heater terminals 140, such that current flow between the two read terminals 130 crosses between the two heater terminals 140. In various embodiments, the read terminals 130 can be on opposite electrically insulating walls 120.

In various embodiments, the heater terminals 140 can have a width or diameter less than 40 nanometers (nm), or in a range of about 5 nm to about 40 nm, or about 10 nm to about 30, or about 10 nm to about 20 nm, although other widths or diameters are contemplated.

In various embodiments, the read terminals 130 can have a width or diameter greater than 40 nanometers (nm), or in a range of about 40 nm to about 100 nm, or about 50 nm to about 90, or about 70 nm to about 80 nm, although other widths or diameters are contemplated. The read terminals 130 can have a greater width or diameter to reduce resistance during read operations, whereas the heater terminals 140 can have a smaller width or diameter to focus heating on a smaller region of the PCM.

In various embodiments, the heater terminals 140 can be made of a metal compound, including, but not limited to, metal nitrides, for example, titanium nitride (TiN), tantalum nitride (TaN), tungsten nitride (WN), and combinations thereof; metal silicides, for example, titanium silicide (TiSi), cobalt silicide (CoSi), nickel silicide (NiSi), and combinations thereof; and metal carbides, for example, titanium carbide (TiC), tantalum carbide (TaC), a higher resistance metal, for example, tungsten (W), cobalt (Co), platinum (Pt), palladium (Pd), or tantalum (Ta), and combinations thereof.

In one or more embodiments, the volume of the phase change material within the electrically insulating wall 120 can be in a first phase 110 and a second phase 115. The second phase 115 can be an amorphous phase that has a higher resistivity than a crystalline phase. The second phase 115 can be hemispherical in shape and overlap the edges of the heater terminals 140, where the diameter and shape of the second phase 115 region of the phase change material can be determined by the heat transport from the heater terminals 140 into the phase change material. In various embodiments, the second phase 115 region of the phase change material can be hemispherical. By controlling the amount of amorphous volume, a continuum of resistance states can be programmed. In various embodiments, the dimensions of the volume of the phase change material within the electrically insulating wall 120 can be in a range of about 50 nm (length)×50 nm (width)×50 nm (height) to about 250 nm (length)×250 nm (width)×100 nm (height), (0.000123 um$^3$ to about 0.00625 um$^3$), or about 100 nm (length)×100 nm (width)×50 nm (height) to about 150 nm (length)×150 nm (width)×100 nm (height), (0.0005 um$^3$ to about 0.00225 um$^3$), although other lengths, widths, heights, and volumes are contemplated.

Figure 2:
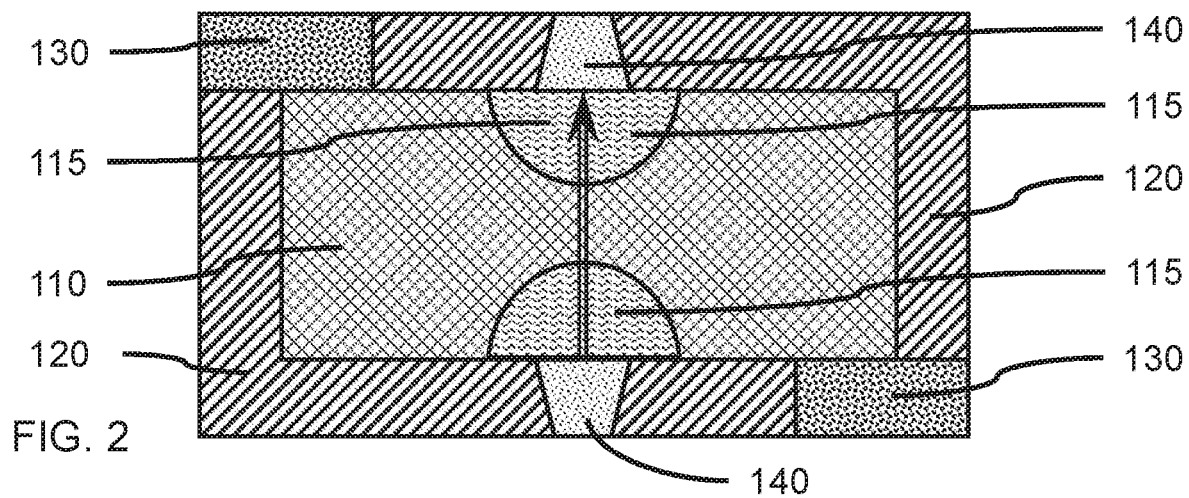
FIG. 2 is a cross-sectional side view showing a phase change memory device during a write process, in accordance with an embodiment of the present invention.

FIG. 2 is a cross-sectional side view showing a phase change memory device during a write process, in accordance with an embodiment of the present invention.

In one or more embodiments, information can be written to the phase change memory device 100 by passing a current from a first heater terminal 140 in the electrically insulating wall 120 through a region of the phase change material to a second heater terminal 140 in the electrically insulating wall 120 a distance from the first heater terminal 140. Passage of current through each of the heater terminals 140 can increase the temperature of the heater terminals 140 due to resistive heating, whereas the high conductivity of the first phase 110 of the phase change material can conduct the electrical current without sufficient heating to cause a phase change. The current through the heater terminals 140 and first phase

110 (e.g., crystalline phase) of the phase change material can be a current pulse, $I_{prog}$, in a range of about 50 microAmps (uA) to about 900 uA, or about 50 microAmps (uA) to about 900 uA, or about 70 uA to about 900 uA, or about 70 uA to about 800 uA, for about 40 nanoseconds (ns) to about 200 ns, or about 70 ns to about 150 ns, where the current pulse is sufficient to cause resistive heating of the heater terminals 140 and melt and amorphized the first phase 110 (e.g., crystalline phase) of the phase change material.

In various embodiments, the heater terminals 140 can generate an increase in temperature of the surrounding first phase 110 (e.g., crystalline phase) of the phase change material to a temperature in a range of about 600° C. to about 900° C., or about 650° C. to about 750° C., where the change in temperature is sufficient to cause a change in the phase change material from the first phase 110 (e.g., crystalline phase) to the second phase 115 (e.g., amorphous phase) in an adjoining region of the phase change material. In various embodiments, the region of the phase change material converted to the second phase 115 (e.g., amorphous phase) can be a projection having a hemispherical shape adjoining each of the heater terminals 140.

In various embodiments, the crystalline phase of the phase change material can have a resistivity in a range of about 0.01 ohm-cm to about 6 ohm-cm, or in a range of about 0.1 ohm-cm to about 4 ohm-cm, or about 1 ohm-cm, although other resistivities are possible.

In various embodiments, the amorphous phase of the phase change material can have a resistivity in a range of about $1 \times 10^3$ ohm-cm to about $1 \times 10^6$ ohm-cm, or greater than about $1 \times 10^6$ ohm-cm, although other resistivities are possible.

Figure 3:
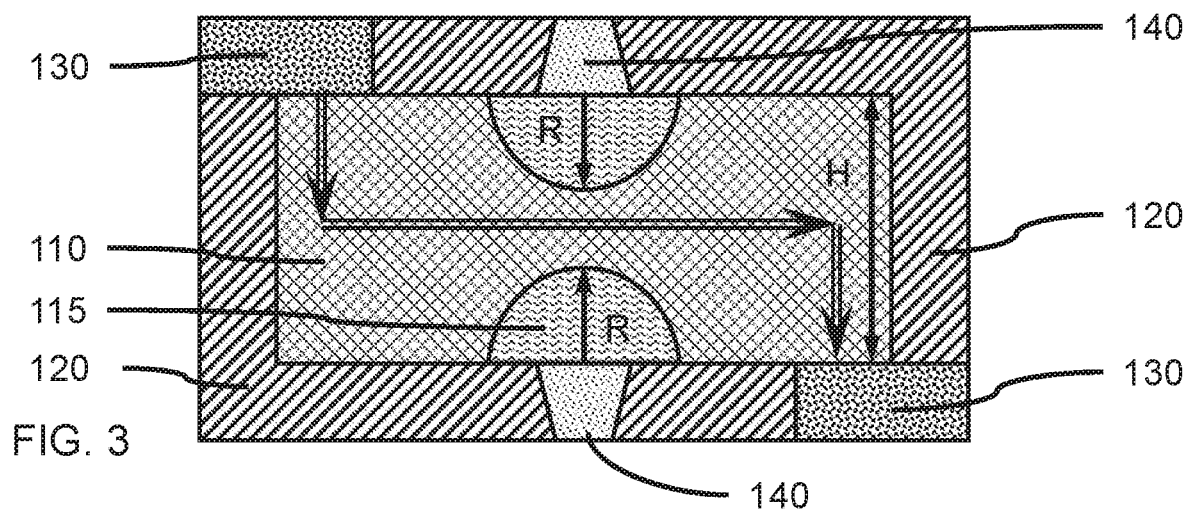
FIG. 3 is a cross-sectional side view showing a phase change memory device during a read process, in accordance with an embodiment of the present invention.

FIG. 3 is a cross-sectional side view showing a phase change memory device during a read process, in accordance with an embodiment of the present invention.

In one or more embodiments, the state of a phase change memory device 100 can be determined by measuring the electrical resistance between two read terminals 130 along an electrical path through the first phase 110 of the phase change material, where at least a portion of the electrical path is between regions of the second phase 115 region of the phase change material. The read current can bypass the second phase 115 region of the phase change material.

The second phase 115 region of the phase change material can be hemispherical with a radius in a range of about 40 nanometers (nm) to about 70 nm, or about 50 nm to about 60 nm, where the heating of the PCM is symmetrical around the heater terminal(s) 140. In various embodiments, the normalized conductance of the PCM device can be related to 1−2R/H, where R is the radius of the hemispherical second phase 115 region, and H is the height of the wall of the phase change material volume.

In various embodiments, the phase change memory deice can have two or more states, for example, two, three, four, or five states that can be determined. The ratio of the cross-sectional area of the second phase 115 of the phase change material to the first phase 110 of the phase change material can determine the state of a phase change memory device 100. The state of the phase change material through a cross-sectional area can be non-uniform, so the current density through the high conductance phase material and low conductance phase material can be non-uniform.

In various embodiments, the state of the phase change memory device can be determined by measuring the resistance of the device through the read terminals.

Figure 4:
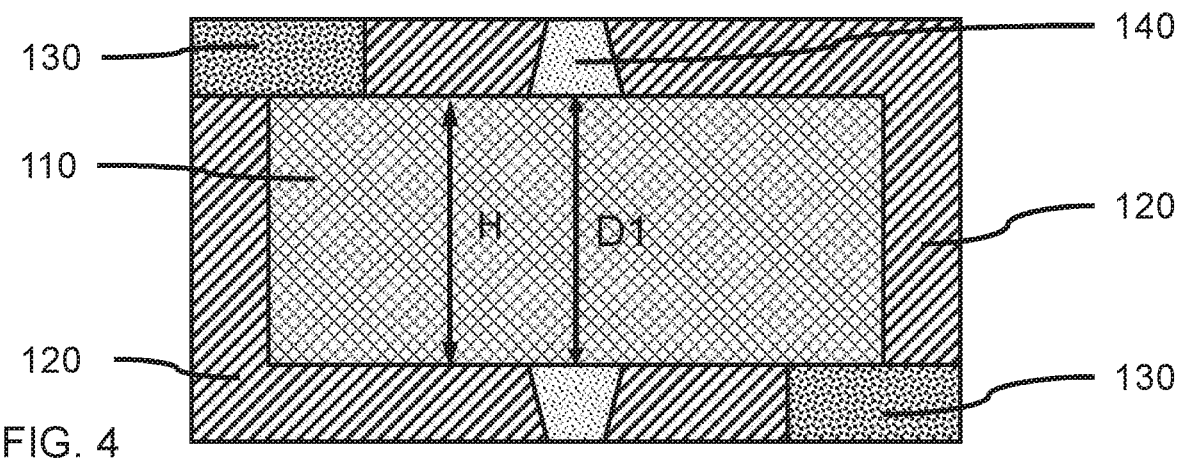
FIG. 4 is a cross-sectional side view showing a phase change memory device that has been fully set, in accordance with an embodiment of the present invention.

FIG. 4 is a cross-sectional side view showing a phase change memory device that has been fully set, in accordance with an embodiment of the present invention.

In one or more embodiments, a phase change memory device 100 can be fully set by crystallizing the full volume of the phase change material to a first phase 110 (e.g., crystalline phase, where the phase change memory device 100 can be fully set by fully heating the phase change memory with a large current and slow decrease in the current to allow the phase change memory material to slowly cool and recrystallize in the crystalline state. When fully set, the distance, D1, between the heater terminals 140 occupied by first phase 110 of the phase change material can be equal to the full height, H, of the phase change memory device 100. The resistance experienced by a read current would, therefore, be the resistance of the first phase 110 of the phase change material (e.g., crystalline phase resistance).

In various embodiments, the phase change memory device 100 can have a height in a range of about 40 nm to about 100 nm, although other heights are contemplated. In various embodiments, the phase change memory device 100 can have a width in a range of about 40 nm to about 300 nm, although other widths are contemplated.

Figure 5:
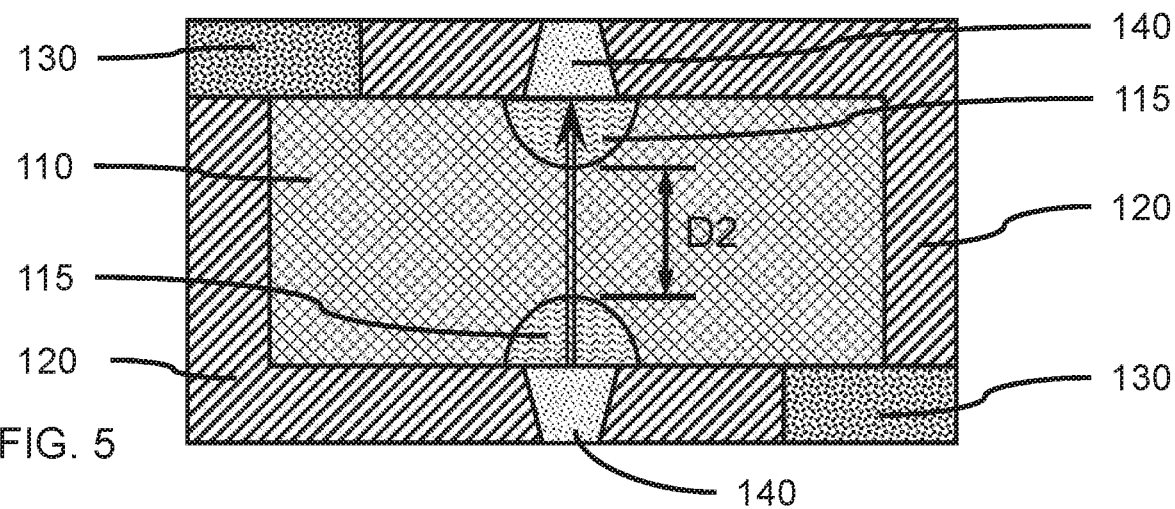
FIG. 5 is a cross-sectional side view showing a phase change memory device that has been partially reset, in accordance with an embodiment of the present invention.

FIG. 5 is a cross-sectional side view showing a phase change memory device that has been partially set, in accordance with an embodiment of the present invention.

In one or more embodiments, a phase change memory device 100 can be partially set by amorphizing a portion of the first phase 110 of the phase change material between the heater terminals 140 using a current pulse and quench of the first phase 110 to form regions of the second phase 115 adjacent to the heater terminals 140. The size and shape of the second phase 115 regions can be determined by the amount of current and duration of the current pulse used to amorphized the first phase 110 of the phase change material. The distance, D2, occupied by the first phase 110 of the phase change material can be less than the full height, H, of the phase change memory device 100 by twice the radius of the second phase 115 regions, 1−2R/H. The resistance experienced by a read current would, therefore, be the resistance of the first phase 110 of the phase change material (e.g., crystalline phase resistance) for the cross-sectional distance, D2.

Figure 6:
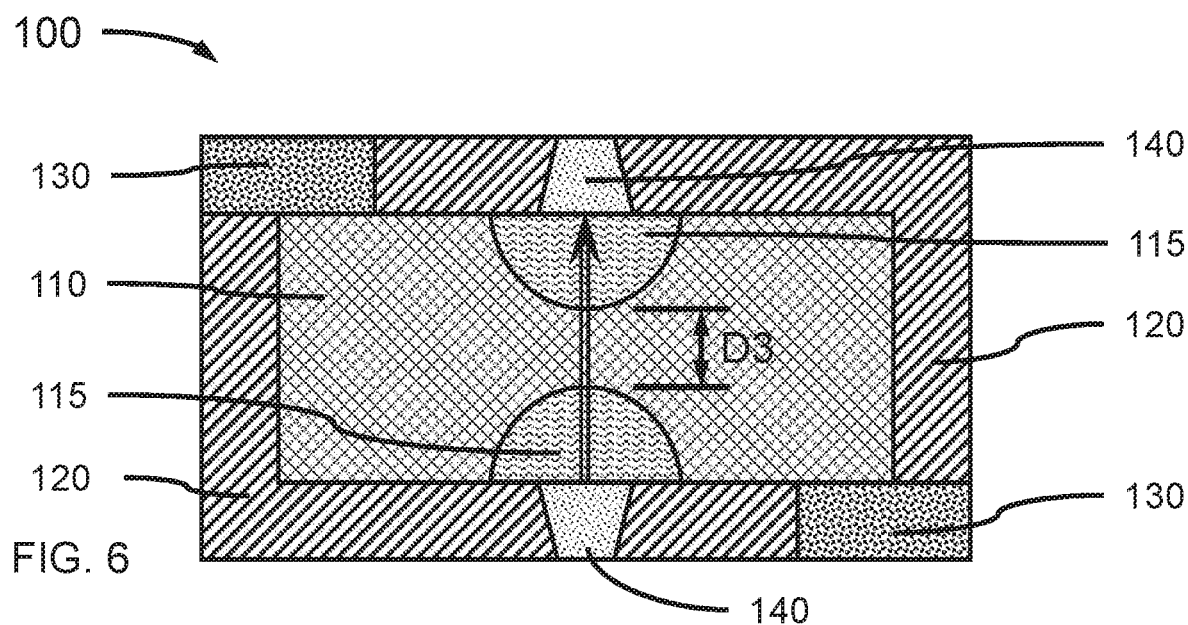
FIG. 6 is a cross-sectional side view showing a phase change memory device that has been partially set, in accordance with an embodiment of the present invention.

FIG. 6 is a cross-sectional side view showing a phase change memory device that has been partially set, in accordance with an embodiment of the present invention.

In one or more embodiments, a phase change memory device 100 can be further partially set by amorphizing a larger portion of the first phase 110 of the phase change material between the heater terminals 140 using a current pulse and quench of the first phase 110 to form regions of the second phase 115 adjacent to the heater terminals 140. The size and shape of the second phase 115 regions can be determined by the amount of current and duration of the current pulse used to amorphized the first phase 110 of the phase change material. The distance, D3, occupied by first phase 110 of the phase change material can be less than the cross-sectional distance, D2, of the phase change memory device 100 by the increased radius of the second phase 115 regions, 1−2R/H. The resistance experienced by a read current would, therefore, be the resistance of the first phase 110 of the phase change material (e.g., crystalline phase resistance) for the cross-sectional distance, D3.

Figure 7:
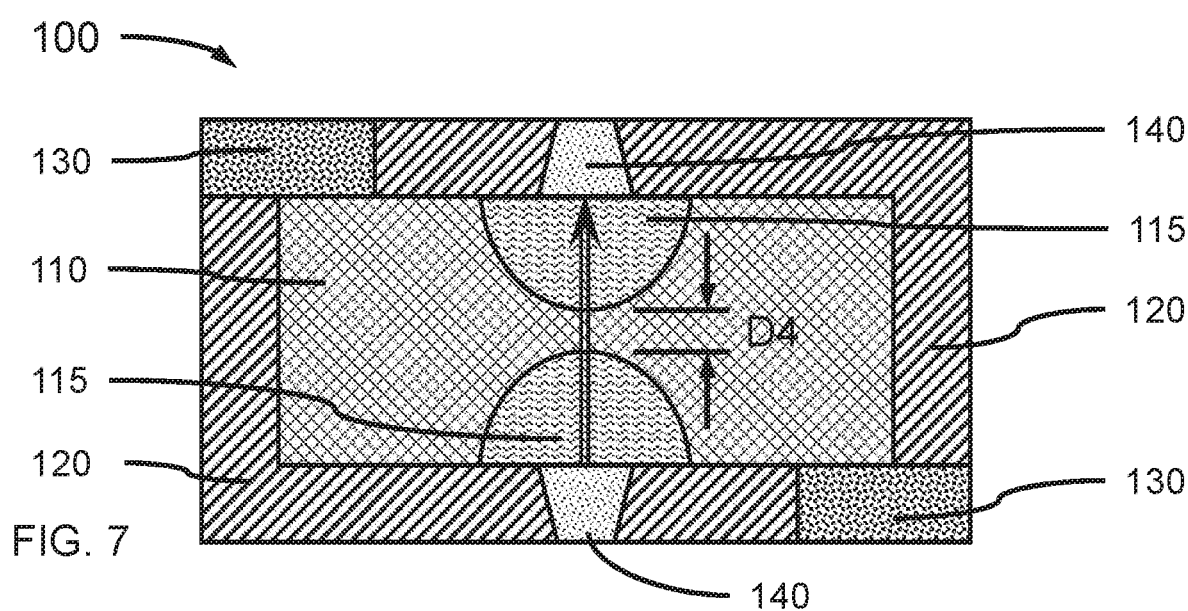
FIG. 7 is a cross-sectional side view showing a phase change memory device that has been fully set, in accordance with an embodiment of the present invention.

FIG. 7 is a cross-sectional side view showing a phase change memory device that has been fully reset, in accordance with an embodiment of the present invention.

In one or more embodiments, a phase change memory device 100 can be fully reset by amorphizing an even larger portion of the first phase 110 of the phase change material between the heater terminals 140 using a current pulse and quench of the first phase 110 to form regions of the second phase 115 adjacent to the heater terminals 140. The size and shape of the second phase 115 regions can be determined by the amount of current and duration of the current pulse used to amorphized the first phase 110 of the phase change material. The distance, D4, occupied by first phase 110 of the phase change material can be less than the cross-sectional distance, D3, of the phase change memory device 100 by the increased radius of the second phase 115 regions, 1−2R/H. The resistance experienced by a read current would, therefore, be the resistance of the first phase 110 of the phase change material (e.g., crystalline phase resistance) for the cross-sectional distance, D4. In various embodiments, the second phase 115 regions do not extend across the full distance between the heater terminals 140, and the entire cross-section of the phase change memory device 100 would not be amorphized. Providing an electrical path through a crystalline phase of the PCM can reduce or avoid resistance drift.

Each of the different distances, D1, D2, D3, and D4, can identify a different state of the phase change memory device 100 based on the resistance between the read terminals 130, and thereby store different data values.

Figure 8:
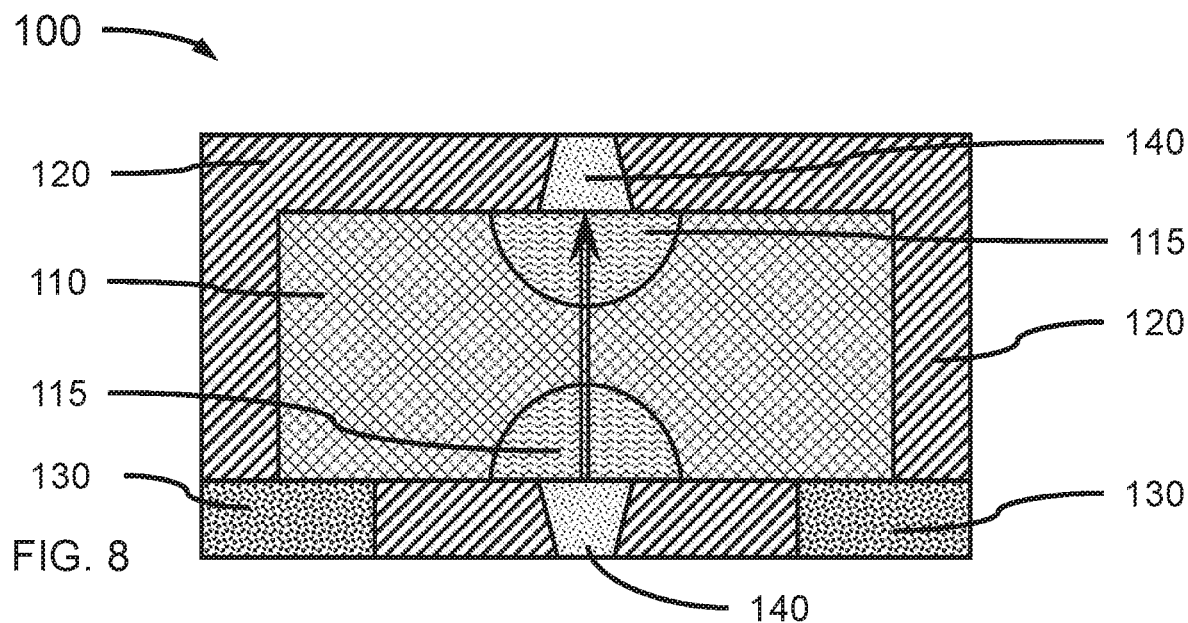
FIG. 8 is a cross-sectional side view showing a phase change memory device having a pair of write terminals and a different arrangement of read terminals showing a write process, in accordance with another embodiment of the present invention.

FIG. 8 is a cross-sectional side view showing a phase change memory device having a pair of write terminals and a different arrangement of read terminals showing a write process, in accordance with another embodiment of the present invention.

In another embodiment, both of the two read terminals 130 can be located along the same electrically insulating wall 120 and separated by the two heater terminals 140 and any second phase 115 regions. The two read terminals 130 can be separated by a distance in a range of about 80 nm to about 300 nm, depending on the width of the device, where the distance is sufficient to allow the formation of second phase 115 regions with a predetermined maximum radius. In various embodiments, the two read terminals 130 can be located in the same sidewall of the electrically insulating wall 120.

In various embodiments, the phase change memory device 100 can be written to using a current pulse between the opposing heater terminals 140.

Figure 9:
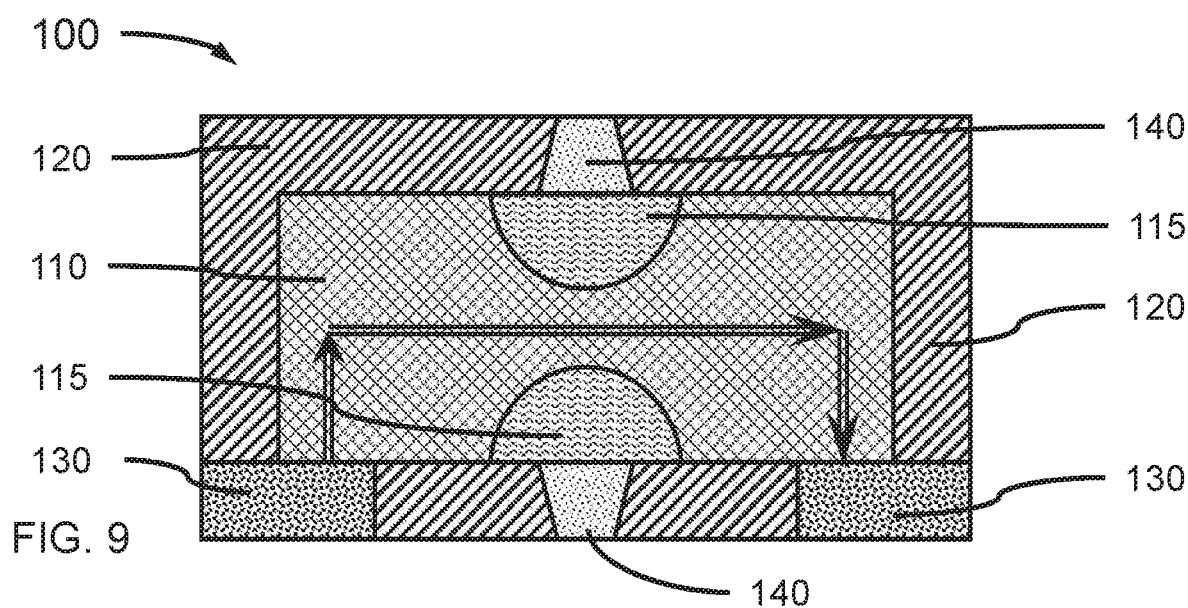
FIG. 9 is a cross-sectional side view showing a phase change memory device having a pair of write terminals and a different arrangement of read terminals showing a read process, in accordance with another embodiment of the present invention.

FIG. 9 is a cross-sectional side view showing a phase change memory device having a pair of write terminals and a different arrangement of read terminals showing a read process, in accordance with another embodiment of the present invention.

In one or more embodiments, the state of the phase change memory device 100 can be determined by passing a read current between the two read terminals 130.

Figure 10:
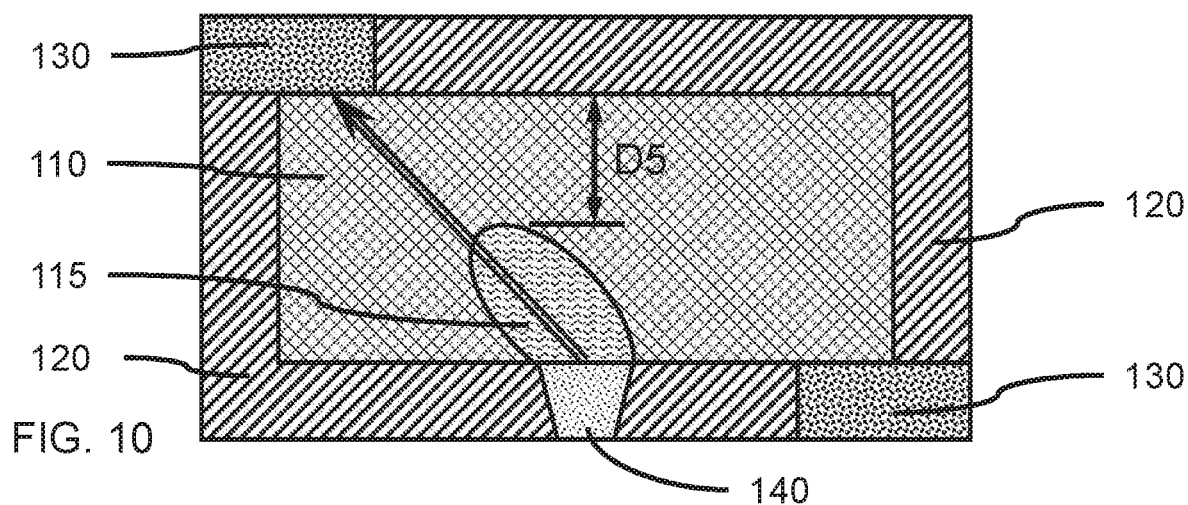
FIG. 10 is a cross-sectional side view showing a phase change memory device having a three terminal arrangement showing a write process, in accordance with another embodiment of the present invention.

FIG. 10 is a cross-sectional side view showing a phase change memory device having a three terminal arrangement showing a write process, in accordance with another embodiment of the present invention.

In one or more embodiments, the phase change memory device 100 can have a single heater terminal 140 and two read terminals 130, where a read terminal 130 opposite the heater terminal 140 can be used to generate a current pulse to write data to the phase change material. A second phase 115 region can be formed adjoining the single heater terminal 140 and protruding towards one of the two read terminals 130, where the second phase 115 region can have a tilted domed shape with a height different from the radius. The distance, D5, occupied by first phase 110 of the phase change material can be between the second phase 115 region and the opposite electrically insulating wall 120.

Figure 11:
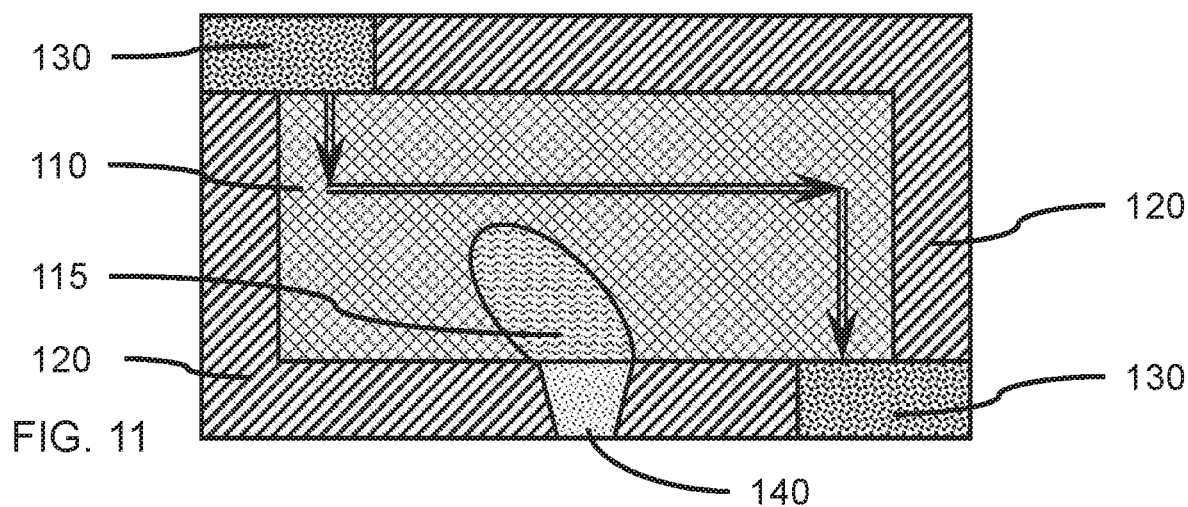
FIG. 11 is a cross-sectional side view showing a phase change memory device having a three terminal arrangement showing a read process, in accordance with another embodiment of the present invention.

FIG. 11 is a cross-sectional side view showing a phase change memory device having a three terminal arrangement showing a read process, in accordance with another embodiment of the present invention.

In one or more embodiments, the state of the phase change memory device 100 can be determined by passing a read current between the two read terminals 130.

Figure 12:
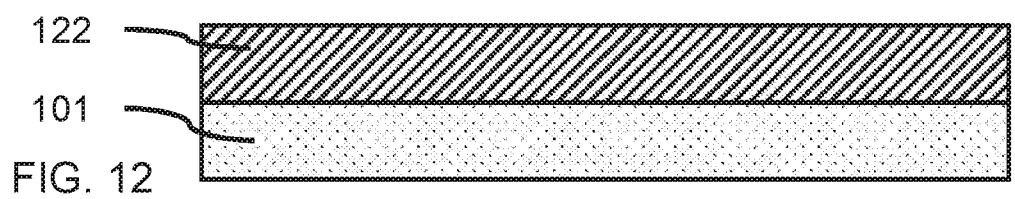
FIG. 12 is a cross-sectional side view showing a base plate layer, in accordance with another embodiment of the present invention.

FIG. 12 is a cross-sectional side view showing a base plate layer, in accordance with another embodiment of the present invention.

In one or more embodiments, a base plate layer 122 can be formed on a substrate 101, where the base plate layer 122 can be formed by a blanket deposition, for example, chemical vapor deposition (CVD), plasma enhanced CVD (PECVD), physical vapor deposition (PVD), a conformal deposition, for example, atomic layer deposition (ALD) plasma enhanced ALD (PEALD), or a combination thereof. The substrate 101 can include a semiconductor material, for example, silicon (Si), or silicon germanium (SiGe), that may have other devices formed thereon.

In various embodiments, the base plate layer 122 can be an insulating, dielectric material, including, but not limited to, silicon oxide (SiO), silicon nitride (SiN), silicon oxynitride (SiON), silicon boro carbonitride (SiBCN), and combinations thereof.

In various embodiments, the base plate layer 122 can have a thickness in a range of about 10 nm to about 60 nm, or about 20 nm to about 40 nm, although other thicknesses are also contemplated.

Figure 13:
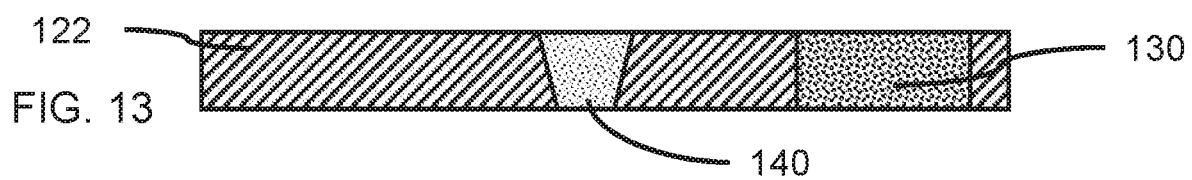
FIG. 13 is a cross-sectional side view showing a heater terminal and a read terminal formed in the base plate layer, in accordance with another embodiment of the present invention.

FIG. 13 is a cross-sectional side view showing a heater terminal and a read terminal formed in the base plate layer, in accordance with another embodiment of the present invention.

In one or more embodiments, openings can be formed in the base plate layer 122 using lithographic processes and etching (e.g., RIE). The openings can be configured and dimensioned to form a read terminal 130 and a heater terminal 140.

In one or more embodiments, conductive material for a read terminal 130 can be deposited in the opening configured for the read terminal. Suitable conductive material for a heater terminal 140 can be deposited in the opening configured for the heater terminal.

Figure 14:
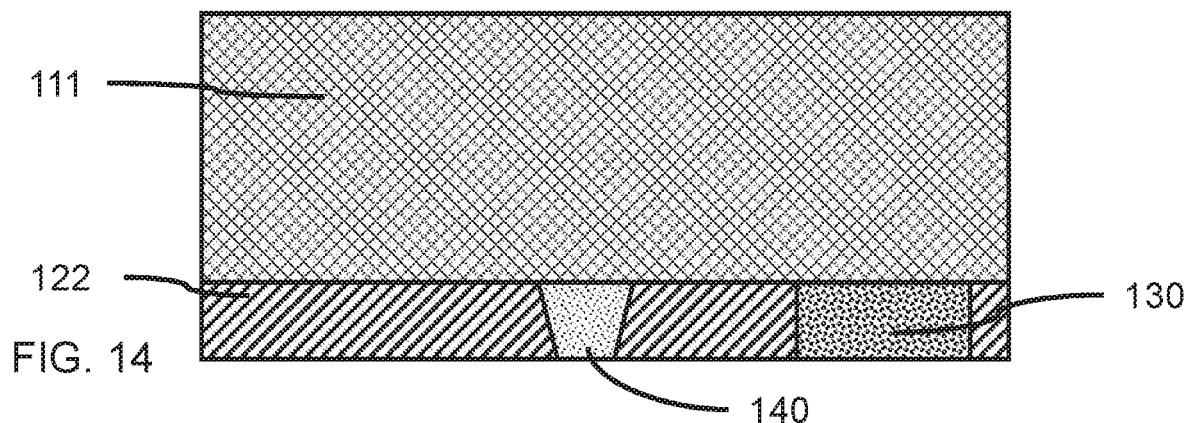
FIG. 14 is a cross-sectional side view showing a phase change material layer formed on the base plate layer, in accordance with another embodiment of the present invention.

FIG. 14 is a cross-sectional side view showing a phase change material layer formed on the base plate layer, in accordance with another embodiment of the present invention.

In one or more embodiments, a phase change material layer 111 can be formed on the base plate layer 122, where the phase change material layer 111 can be formed by a blanket deposition. The phase change material layer 111 can cover and be in electrical and thermal contact with the heater terminal 140, and in electrical contact with the read terminal 130.

In various embodiments, the phase change material layer 111 can have a thickness in a range of about 40 nm to about 100 nm, or about 50 nm to about 100 nm, although other thicknesses are also contemplated.

Figure 15:
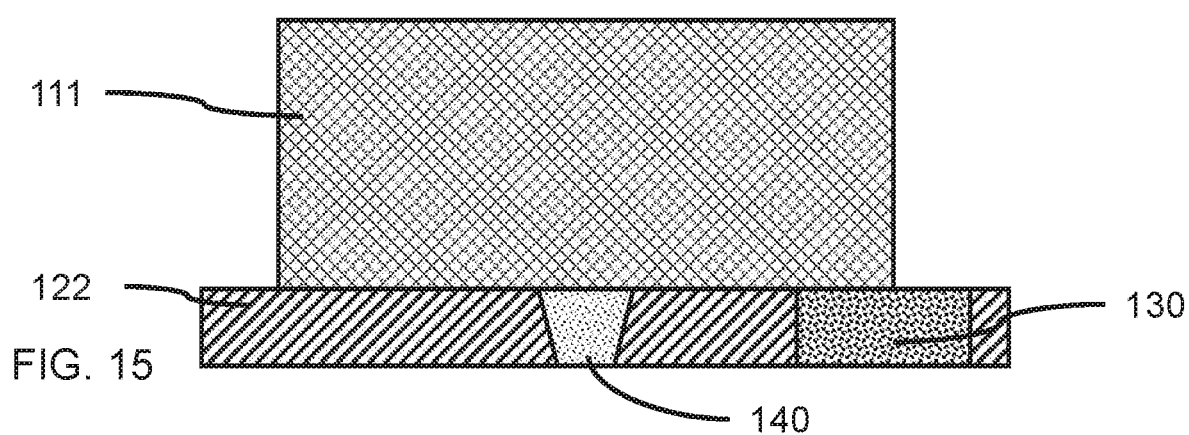
FIG. 15 is a cross-sectional side view showing the phase change material layer patterned on the base plate layer, in accordance with another embodiment of the present invention.

FIG. 15 is a cross-sectional side view showing the phase change material layer patterned on the base plate layer, in accordance with another embodiment of the present invention.

In one or more embodiments, a phase change material layer 111 can be patterned using lithographic techniques and etching to remove portions of the phase change material layer 111 and expose sections of the base plate layer 122.

In various embodiments, the phase change material layer 111 can have a width in a range of about 40 nm to about 300 nm, or about 50 nm to about 250 nm, although other widths are also contemplated.

Figure 16:
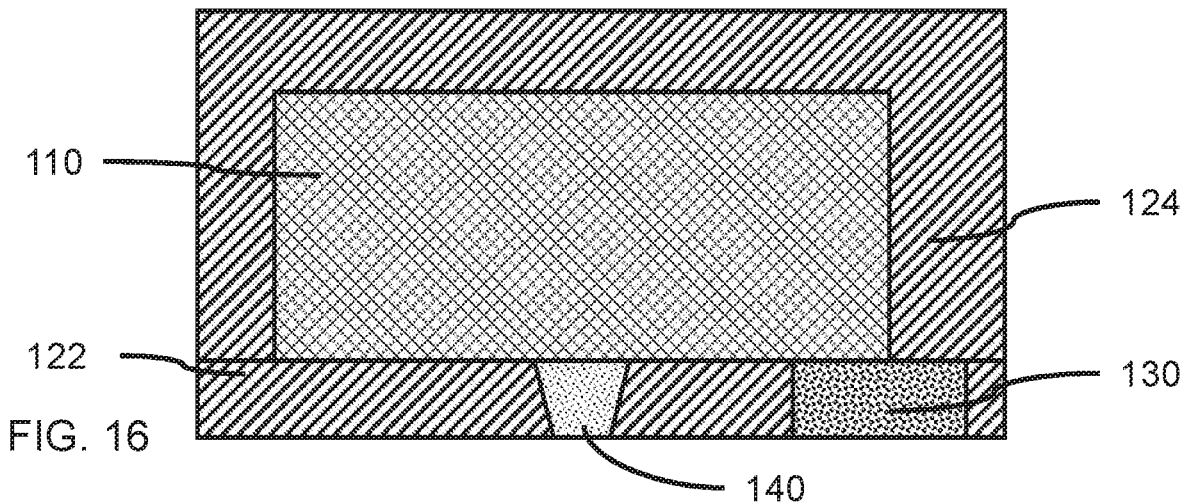
FIG. 16 is a cross-sectional side view showing an encasement layer formed on the patterned phase change material layer and base plate layer, in accordance with another embodiment of the present invention.

FIG. 16 is a cross-sectional side view showing an encasement layer formed on the patterned phase change material layer and base plate layer, in accordance with another embodiment of the present invention.

In one or more embodiments, an encasement layer 124 can be formed on the patterned phase change material having a first phase 110 and the base plate layer 122. The encasement layer 124 can be formed by a conformal deposition, a blanket deposition, or a combination thereof. The encasement layer 124 can surround the patterned phase change material layer 111 and cover exposed sections of the base plate layer 122 to form an electrically insulating wall 120 that can surround the patterned phase change material.

In various embodiments, the encasement layer 124 can be an insulating, dielectric material, including, but not limited to, silicon oxide (SiO), silicon nitride (SiN), silicon oxynitride (SiON), silicon boro carbonitride (SiBCN), and combinations thereof.

Figure 17:
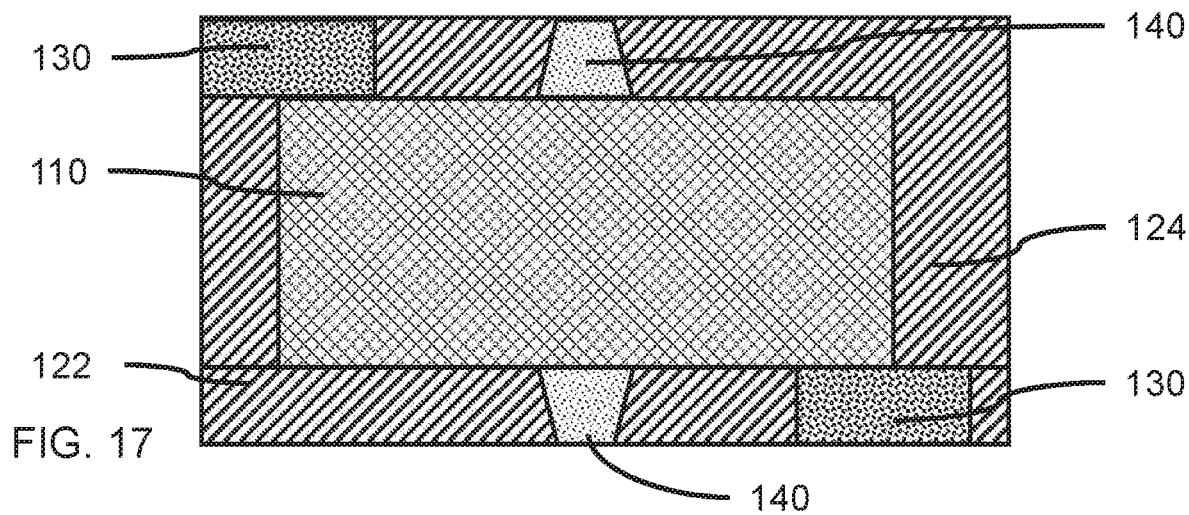
FIG. 17 is a cross-sectional side view showing a second heater terminal and a second read terminal formed in the encasement layer, in accordance with another embodiment of the present invention.

FIG. 17 is a cross-sectional side view showing a second heater terminal and a second read terminal formed in the encasement layer, in accordance with another embodiment of the present invention.

In one or more embodiments, a second heater terminal 140 and a second read terminal 130 can be formed in the encasement layer 124. The second heater terminal 140 and second read terminal 130 can be formed by forming openings in the encasement layer 124 at predetermined locations using lithography and etching. Conductive material for a read terminal 130 can be deposited in the opening configured for the read terminal. Suitable conductive material for a heater terminal 140 can be deposited in the opening configured for the heater terminal.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A phase change memory device, comprising:
    a phase change memory material within an electrically insulating wall, wherein the phase change memory material is configured to store multiple data bits;
    a first heater terminal in the electrically insulating wall, wherein the first heater terminal is configured to control the relative volumes of an amorphous phase and a crystalline phase of the phase change memory material in an electrical read path;
    a first read terminal and a second read terminal, each having a topmost surface and a bottommost surface, in the electrically insulating wall configured to form the electrical read path between the two read terminals that crosses the first heater terminal, wherein the topmost surface and the bottommost surface of the first read terminal are horizontally aligned with a topmost surface and a bottommost surface of the first heater terminal, respectively, and wherein the first and second read terminals have a substantially consistent width from the topmost surfaces to the bottommost surfaces; and
    a second heater terminal in the electrically insulating wall, wherein the second heater terminal is separated from the first heater terminal by a thickness of the phase change memory material, and wherein the topmost surface and the bottommost surface of the second heater terminal are horizontally aligned with a topmost surface and a bottommost surface of the second heater terminal, respectively.

2. The phase change memory device of claim 1, wherein the second heater terminal is opposite the first heater terminal, and wherein each of the first and second read terminals has a surface coplanar with an inner surface of the electrically insulating wall.

3. The phase change memory device of claim 1, wherein at least a portion of the phase change memory material is in the crystalline phase.

4. The phase change memory device of claim 3, wherein at least a portion of the phase change memory material is in the amorphous phase.

5. The phase change memory device of claim 4, wherein the amorphous phase of the phase change memory material is in the shape of a hemisphere adjoining the first heater terminal.

6. The phase change memory device of claim 4, wherein the phase change memory material has dimensions in a range of about 50 nm (length)×50 nm (width)×50 nm (height) to about 250 nm (length)×250 nm (width)×100 nm (height).

7. The phase change memory device of claim 4, wherein the amorphous phase of the phase change memory material includes a first hemisphere adjoining the first heater terminal and a second hemisphere adjoining a second heater terminal.

8. The phase change memory device of claim 7, wherein the first read terminal directly contacts a top surface of the phase change memory material and the second read terminal directly contacts a bottom surface of the phase change memory material.

9. A phase change memory device, comprising:
    a phase change memory material within an electrically insulating wall;
    two heater terminals in the electrically insulating wall, wherein the heater terminals are on opposite sides of the phase change memory material such that the phase change memory material stores multiple data bits through control of relative volumes of an amorphous phase and a crystalline phase of the phase change memory material in an electrical read path; and
    two read terminals in the electrically insulating wall, wherein the read terminals are on opposite sides of the two heater terminals and configured to form the electrical read path, and wherein the two read terminals have the same thickness as the electrically insulating wall, wherein the two heater terminals have a width or diameter less than 40 nanometers (nm), and the two read terminals have a width or diameter greater than 40 nanometers (nm).

10. The phase change memory device of claim 9, wherein the two read terminals are located along the same side of the electrically insulating wall.

11. The phase change memory device of claim 9, wherein the two heater terminals have a width or diameter in a range of about 10 nanometers (nm) to about 30 nm, and the two read terminals have a width or diameter in a range of about 50 nm to about 90 nm.

12. The phase change memory device of claim 9, wherein the two heater terminals are made of a material selected from the group consisting of titanium nitride (TiN), tantalum nitride (TaN), tungsten nitride (WN), titanium silicide (TiSi), cobalt silicide (CoSi), nickel silicide (NiSi), titanium carbide (TiC), tantalum carbide (TaC), tungsten (W), cobalt (Co), platinum (Pt), palladium (Pd), or tantalum (Ta), and combinations thereof.

13. The phase change memory device of claim 12, wherein the phase change memory material is $Ge_2Sb_2Te_5$ (GST).

14. A method of forming a phase change memory device, comprising:
  forming a base plate layer on a substrate;
  forming a first read terminal and a first heater terminal in the base plate layer;
  forming a patterned phase change memory material having a first phase on the base plate layer;
  forming an encapsulation layer on the patterned phase change memory material;
  forming a second read terminal having a topmost surface and a bottommost surface in the encapsulation layer, wherein the second read terminal is in electrical contact with the patterned phase change memory material, wherein the phase change memory device is configured to have four or more memory states through control of relative volumes of an amorphous phase and a crystalline phase of the phase change memory material in an electrical read path between the first read terminal and the second read terminal that crosses the first heater terminal, wherein a topmost surface and a bottommost surface of the first read terminal are horizontally aligned with a topmost surface and a bottommost surface of the first heater terminal, respectively, and wherein the first and second read terminals have a substantially consistent width from the topmost surfaces to the bottommost surfaces; and
  forming a second heater terminal in the encapsulation layer, wherein the second heater terminal is separated from the first heater terminal by a thickness of the phase change memory material, and wherein the topmost surface and the bottommost surface of the second read terminal are horizontally aligned with a topmost surface and a bottommost surface of the second heater terminal, respectively.

15. The method of claim 14, further comprising forming a second heater terminal in the encapsulation layer, wherein the two heater terminals have a width or diameter less than 40 nanometers (nm), and the two read terminals have a width or diameter greater than 40 nanometers (nm).

16. The method of claim 15, wherein the phase change memory material is $Ge_2Sb_2Te_5$ (GST).

17. The method of claim 16, wherein at least a portion of the phase change memory material is in a crystalline phase.

18. The method of claim 17, wherein the two heater terminals are separated by a height of the phase change memory material within an electrically insulating wall in a range of about 50 nm to about 100 nm, and wherein each of the first read terminal and the first heater terminal has a surface coplanar with an inner surface of the base plate layer.

* * * * *